(12) United States Patent
Ha

(10) Patent No.: US 8,547,754 B2
(45) Date of Patent: Oct. 1, 2013

(54) CHARGE PUMP OPERATION IN A NON-VOLATILE MEMORY DEVICE

(75) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/471,778

(22) Filed: May 15, 2012

(65) Prior Publication Data
US 2012/0224428 A1 Sep. 6, 2012

Related U.S. Application Data

(62) Division of application No. 13/186,766, filed on Jul. 20, 2011, now Pat. No. 8,194,466, which is a division of application No. 12/627,077, filed on Nov. 30, 2009, now Pat. No. 8,000,152, which is a division of application No. 11/451,822, filed on Jun. 13, 2006, now Pat. No. 7,626,865.

(51) Int. Cl.
*G11C 16/06* (2006.01)

(52) U.S. Cl.
USPC ............ 365/185.25; 365/185.18; 365/189.09; 365/204; 365/206

(58) Field of Classification Search
USPC ........... 365/185.25, 185.18, 204, 206, 189.09
See application file for complete search history.

(56) References Cited

U.S. PATENT DOCUMENTS

| | | | |
|---|---|---|---|
| 4,823,317 A * | 4/1989 | Brahmbhatt | 365/189.08 |
| 4,831,589 A * | 5/1989 | Brahmbhatt | 365/185.23 |
| 5,038,325 A | 8/1991 | Douglas et al. | |
| 5,255,224 A | 10/1993 | Galbi et al. | |
| 5,297,104 A | 3/1994 | Nakashima | |
| 5,430,674 A * | 7/1995 | Javanifard | 365/185.1 |
| 5,442,586 A * | 8/1995 | Javanifard et al. | 365/185.29 |
| 5,680,300 A | 10/1997 | Szepesi et al. | |
| 5,740,109 A | 4/1998 | Morton et al. | |
| 5,861,772 A * | 1/1999 | Lee | 327/589 |
| 5,866,957 A | 2/1999 | Baba et al. | |
| 5,945,870 A | 8/1999 | Chu et al. | |
| 6,137,733 A | 10/2000 | Watanabe | |
| 6,141,262 A * | 10/2000 | Sudo | 365/189.09 |
| 6,166,960 A | 12/2000 | Marneweck et al. | |
| 6,233,177 B1 * | 5/2001 | Shokouhi et al. | 365/185.23 |
| 6,259,632 B1 | 7/2001 | Khouri et al. | |
| 6,259,635 B1 * | 7/2001 | Khouri et al. | 365/189.09 |
| 6,278,639 B1 | 8/2001 | Hosono et al. | |
| 6,310,789 B1 | 10/2001 | Nebrigic et al. | |
| 6,356,469 B1 | 3/2002 | Roohparvar et al. | |
| 6,373,325 B1 | 4/2002 | Kuriyama | |
| 6,385,065 B1 | 5/2002 | Roohparvar et al. | |
| 6,392,928 B1 * | 5/2002 | Roohparvar | 365/185.18 |
| 6,438,032 B1 | 8/2002 | Pekny et al. | |
| 6,445,623 B1 | 9/2002 | Zhang et al. | |
| 6,480,436 B2 | 11/2002 | Confalonieri et al. | |
| 6,493,268 B1 | 12/2002 | Khouri et al. | |

(Continued)

*Primary Examiner* — Viet Q Nguyen

(74) *Attorney, Agent, or Firm* — Leffert Jay & Polglaze, P.A.

(57) ABSTRACT

A charge pump in a memory device is activated to produce a programming voltage prior to data loading during a programming operation. During an initial programming cycle, first and second load voltages are charged from the charge pump. The first load is removed from the charge pump during a verify operation. The first load voltage is subsequently recharged by charge sharing from the second load voltage so that the charge pump is not initially necessary for recharging the first load voltage.

20 Claims, 5 Drawing Sheets

(56) References Cited

U.S. PATENT DOCUMENTS

| | | |
|---|---|---|
| 6,498,761 B2 | 12/2002 | Banba et al. |
| 6,518,828 B2 | 2/2003 | Seo et al. |
| 6,522,558 B2 | 2/2003 | Henry |
| 6,535,424 B2 * | 3/2003 | Le et al. ............ 365/185.18 |
| 6,538,930 B2 * | 3/2003 | Ishii et al. ............ 365/189.09 |
| 6,560,145 B2 | 5/2003 | Martines et al. |
| 6,573,780 B2 | 6/2003 | Lin et al. |
| 6,618,296 B2 | 9/2003 | Zhang |
| 6,633,494 B2 | 10/2003 | Roohparvar et al. |
| 6,657,875 B1 * | 12/2003 | Zeng et al. ............ 363/59 |
| 6,661,682 B2 | 12/2003 | Kim et al. |
| 6,683,488 B2 | 1/2004 | Jin |
| 6,724,241 B1 | 4/2004 | Bedarida et al. |
| 6,735,118 B2 | 5/2004 | Ogura et al. |
| 6,765,428 B2 | 7/2004 | Kim et al. |
| 6,774,708 B2 | 8/2004 | Matsui |
| 6,781,256 B2 | 8/2004 | Loechner |
| 6,785,180 B2 | 8/2004 | Cheung |
| 6,788,578 B1 | 9/2004 | Tang |
| 6,801,455 B2 | 10/2004 | Natori |
| 6,822,884 B1 | 11/2004 | Rosenthal et al. |
| 6,836,957 B2 | 1/2005 | Kobayashi |
| 6,912,172 B2 | 6/2005 | Honma et al. |
| 6,933,768 B2 | 8/2005 | Hausmann |
| 6,937,517 B2 | 8/2005 | Pekny et al. |
| 6,960,955 B2 | 11/2005 | Nonaka |
| 7,042,788 B2 | 5/2006 | Miki |
| 7,064,529 B2 | 6/2006 | Telecco |
| 7,082,062 B2 | 7/2006 | Kawamoto |
| 7,208,995 B2 | 4/2007 | Hashimoto |
| 7,248,521 B2 | 7/2007 | Patel et al. |
| 7,256,640 B2 | 8/2007 | Ucciardello et al. |
| 7,274,602 B2 | 9/2007 | Arakawa |
| 7,352,626 B1 * | 4/2008 | Wu et al. ............ 365/185.18 |
| 7,375,992 B2 | 5/2008 | Mok et al. |
| 7,385,377 B2 | 6/2008 | Pisasale et al. |
| 7,411,835 B2 | 8/2008 | Darrer |
| 7,439,797 B2 | 10/2008 | Byeon et al. |
| 7,443,735 B2 * | 10/2008 | Pan ............ 365/185.23 |
| 7,486,128 B2 | 2/2009 | Yen et al. |
| 7,599,231 B2 | 10/2009 | Passerini et al. |
| 7,626,445 B2 | 12/2009 | Lesso et al. |
| 7,626,865 B2 * | 12/2009 | Ha ............ 365/185.18 |
| 8,000,152 B2 * | 8/2011 | Ha ............ 365/185.25 |
| 8,044,705 B2 * | 10/2011 | Nandi et al. ............ 327/536 |
| 8,194,466 B2 * | 6/2012 | Ha ............ 365/185.25 |
| 2005/0057236 A1 * | 3/2005 | Telecco ............ 323/274 |

\* cited by examiner

CHARGE PUMP OPERATION IN A NON-VOLATILE MEMORY DEVICE

RELATED APPLICATIONS

This application is a divisional of U.S. application Ser. No. 13/186,766, titled "CHARGE PUMP OPERATION IN A NON-VOLATILE MEMORY DEVICE," filed Jul. 20, 2011 and issued as U.S. Pat. No. 8,194,466 on Jun. 5, 2012, that is a divisional of U.S. application Ser. No. 12/627,077 of the same title, filed Nov. 30, 2009 and issued as U.S. Pat. No. 8,000,152 on Aug. 16, 2011, that is a divisional of U.S. application Ser. No. 11/451,822 of the same title, filed Jun. 13, 2006 and issued as U.S. Pat. No. 7,626,865 on Dec. 1, 2009, that are commonly assigned and incorporated herein by reference.

TECHNICAL FIELD

The present invention relates generally to memory devices and in particular the present invention relates to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

A charge pump circuit is used in a non-volatile memory device to generate the voltages required for chip operation. A charge pump is an electronic circuit that uses capacitors as energy storage elements to convert DC voltages into other DC voltages.

A typical charge pump uses transistors to control the operation of the pump and connection of voltages to the capacitors. For instance, a typical prior art charge pump can generate a higher voltage through multiple stages. A first stage involves a capacitor being connected across a voltage and charged up. In a second stage, the capacitor is disconnected from the original charging voltage and reconnected with its negative terminal to the original positive charging voltage. Because the capacitor mostly retains the voltage across it, except for leakage, the positive terminal voltage is added to the original, effectively doubling the voltage. The pulsing nature of the higher voltage output is typically smoothed by the use of another capacitor at the output.

FIG. 1 illustrates a typical prior art charge pump circuit. It comprises a charge pump 100 that outputs regulated voltage $V_{out\_reg}$ to a parasitic load 101 and a target load 103. The parasitic load 103 represents line capacitance of the pump output node. The target load 103 is the capacitance of the connected word line to be programmed. Switch $SW_A$ 105 is closed during the programming cycles to connect $V_{out\_reg}$ to the target load 103.

FIG. 2 illustrates a timing chart of a typical prior art non-volatile memory device such as the flash memory integrated circuit charge pump circuit of FIG. 1. The timing chart shows that the I/O lines include the addresses, data, and commands for memory operation.

Referring to FIG. 2, when the command for a program operation is received (e.g., 10H), a program enable signal goes high. The program enable signal then causes the charge pump enable signal to go high to initiate the pumping operation in order to precharge bit lines.

One problem with this charge pump operation is that the operation of the pump circuits causes noise on the bit lines. This can cause problems with programming of the cells that are coupled to the bit lines experiencing the noise. Additionally, a fast pump turn-on creates a peak current that causes a downward spike 200 in the supply voltage ($V_{CC}$) as illustrated in FIG. 2. This can result in unstable memory device operation.

For the reasons stated above, and for other reasons stated below which will become apparent to those skilled in the art upon reading and understanding the present specification, there is a need in the art for more efficient use of charge pumps in a non-volatile memory device.

DETAILED DESCRIPTION

Figure 1:
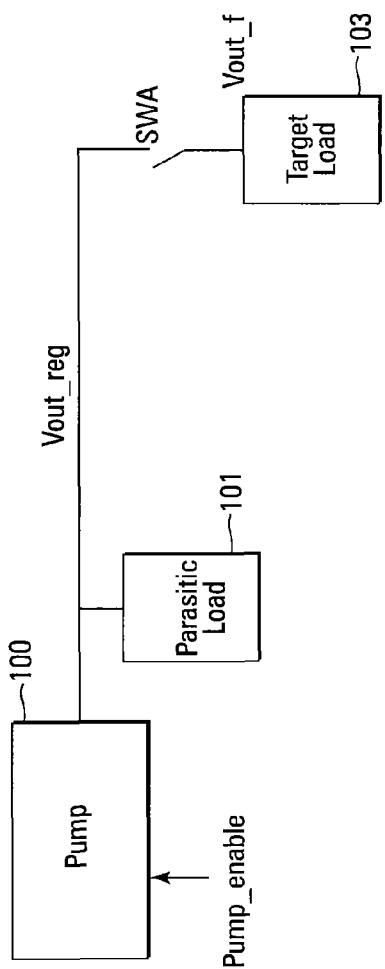
FIG. 1 shows a block diagram of a typical prior art charge pump circuit.
Figure 2:
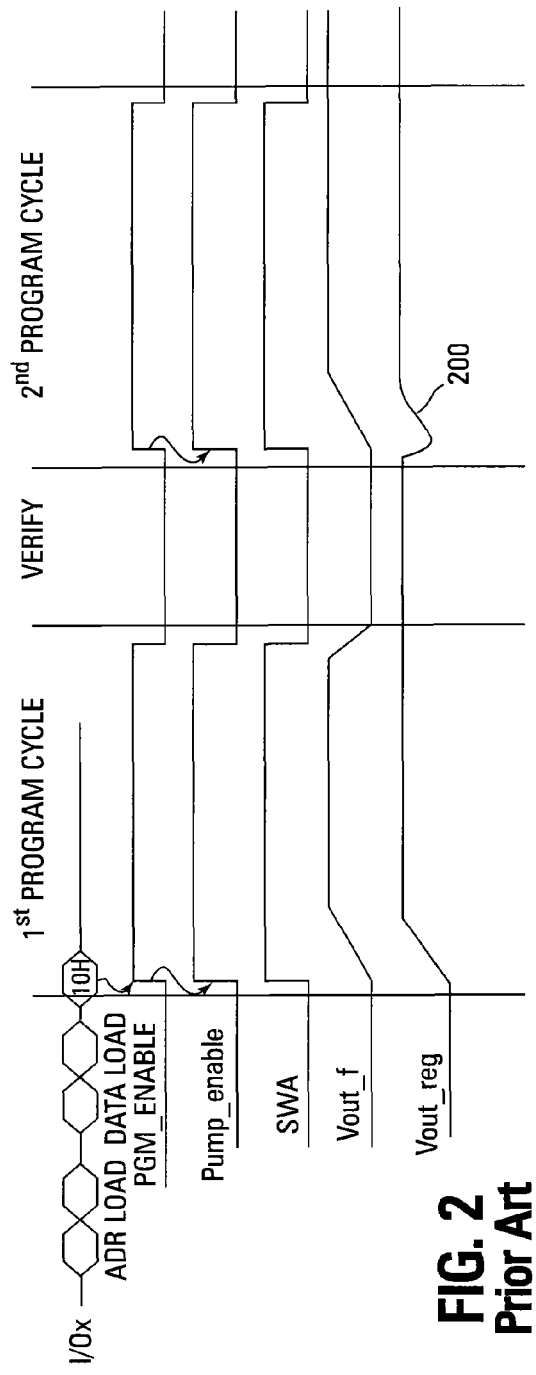
FIG. 2 shows a timing diagram of a typical prior art operation of the charge pump circuit of FIG. 1.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
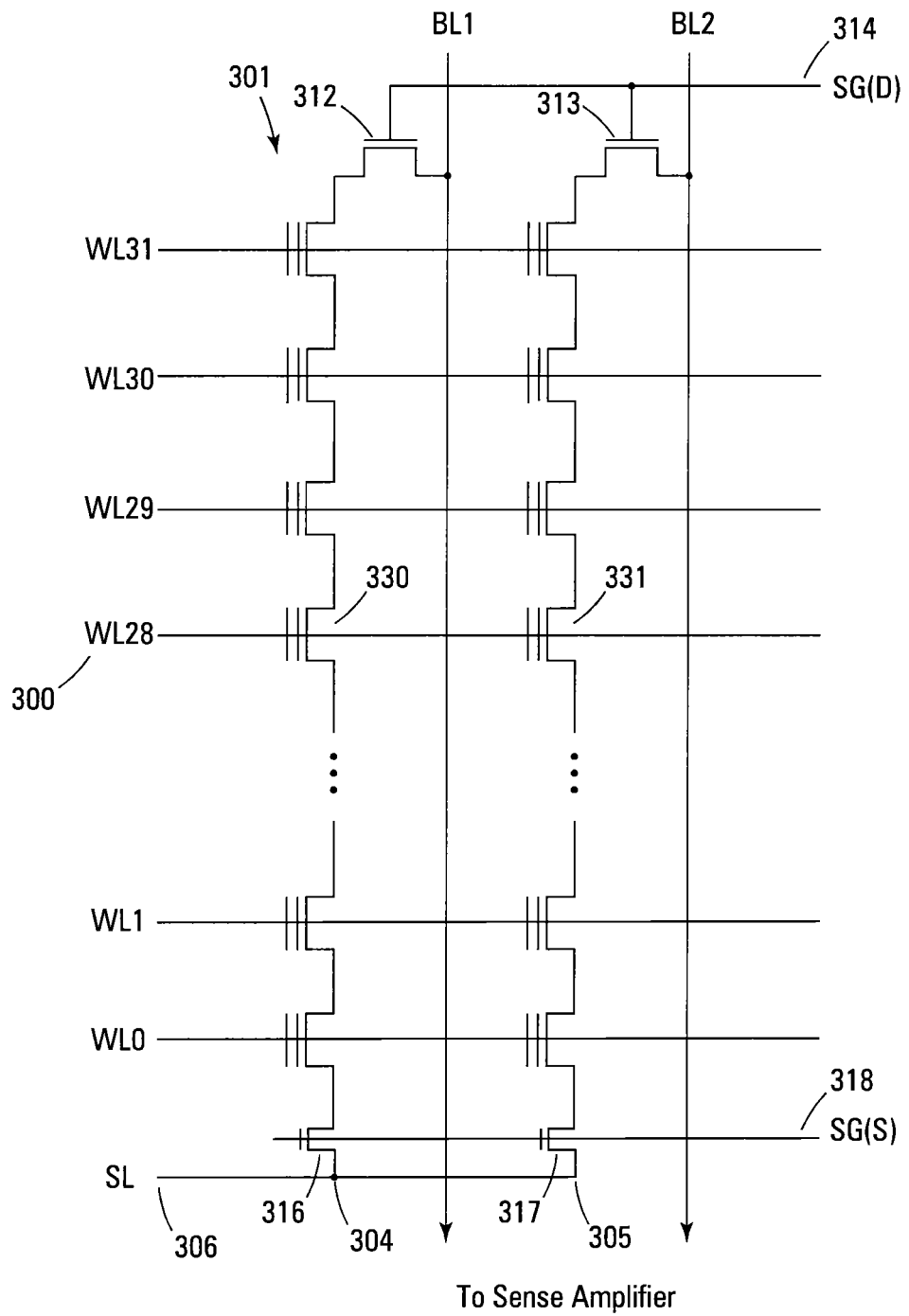
FIG. 3 shows a portion of one embodiment of a NAND architecture flash memory array.

FIG. 3 illustrates a simplified diagram of a typical prior art NAND flash memory array. The memory array of FIG. 3, for purposes of clarity, does not show all of the elements typically required in a memory array. For example, only two bit lines are shown (BL1 and BL2) when the number of bit lines required actually depends upon the memory density.

The array is comprised of an array of floating gate cells 301 arranged in series strings 304, 305. Each of the floating gate cells 301 are coupled drain to source in each series chain 304, 305. A word line (WL0-WL31) that spans across multiple series strings 304, 305 is coupled to the control gates of every floating gate cell in a row in order to control their operation. The bit lines BL1, BL2 are eventually coupled to sense amplifiers (not shown) that detect the state of each cell.

In operation, the word lines (WL0-WL31) select the individual floating gate memory cells in the series chain 304, 305 to be written to or read from and operate the remaining floating gate memory cells in each series string 304, 305 in a pass through mode. Each series string 304, 305 of floating gate memory cells is coupled to a source line 306 by a source select gate 316, 317 and to an individual bit line (BL1, BL2) by a drain select gate 312, 313. The source select gates 316, 317 are controlled by a source select gate control line SG(S) 318 coupled to their control gates. The drain select gates 312, 313 are controlled by a drain select gate control line SG(D) 314.

A selected word line 300 for the flash memory cells 330-331 being programmed is typically biased by programming pulses that start at a voltage of around 16V and may incrementally increase to more than 20V. The unselected word lines for the remaining cells are typically biased at $V_{pass}$. This is typically in an approximate range of 9-10V. The bit lines of the cells to be programmed are typically biased at 0V while the inhibited bit lines are typically biased at $V_{CC}$.

Figure 4:
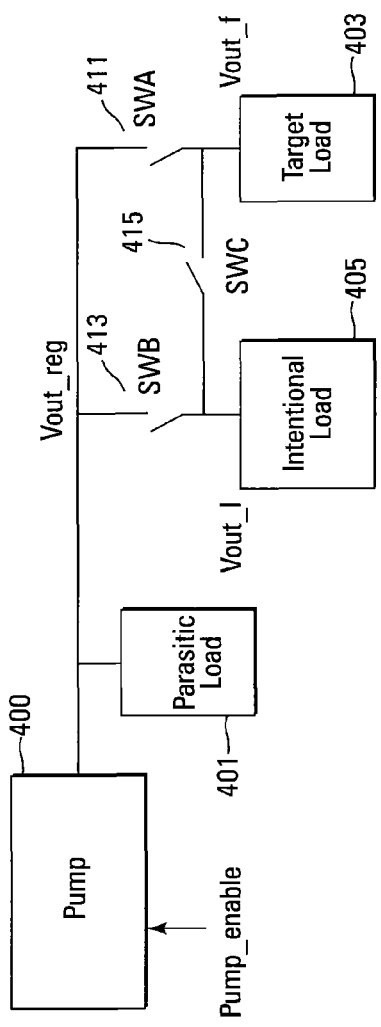
FIG. 4 shows an operational block diagram of one embodiment of a charge pump circuit of the present invention.

FIG. 4 illustrates an operational block diagram of one embodiment of the charge pump circuit of the present invention. The circuit is comprised of the charge pump device 400 that generates the $V_{out\_reg}$ voltage for programming the memory cells. In one embodiment, this voltage is coupled to the word lines of the subsequently described non-volatile memory array.

The parasitic load 401 represents the total capacitance of the output line of the charge pump device 400. The target load 403 represents the load capacitance of the word line to which the charge pump device 400 is currently coupled for programming. The intentional load 405 represents the load that is charged up during idle times to provide charge sharing with the target load.

Switches SWA 411, SWB 413, and SWC 415 provide the switching between the loads. In one embodiment, these switches 411, 413, 415 can be implemented using transistors. SWA 411 couples the target load 403 to the pump 400. SWB 413 couples the intentional load 405 to the pump. SWC 415 couples the intentional load 405 to the target load 403.

Figure 5:
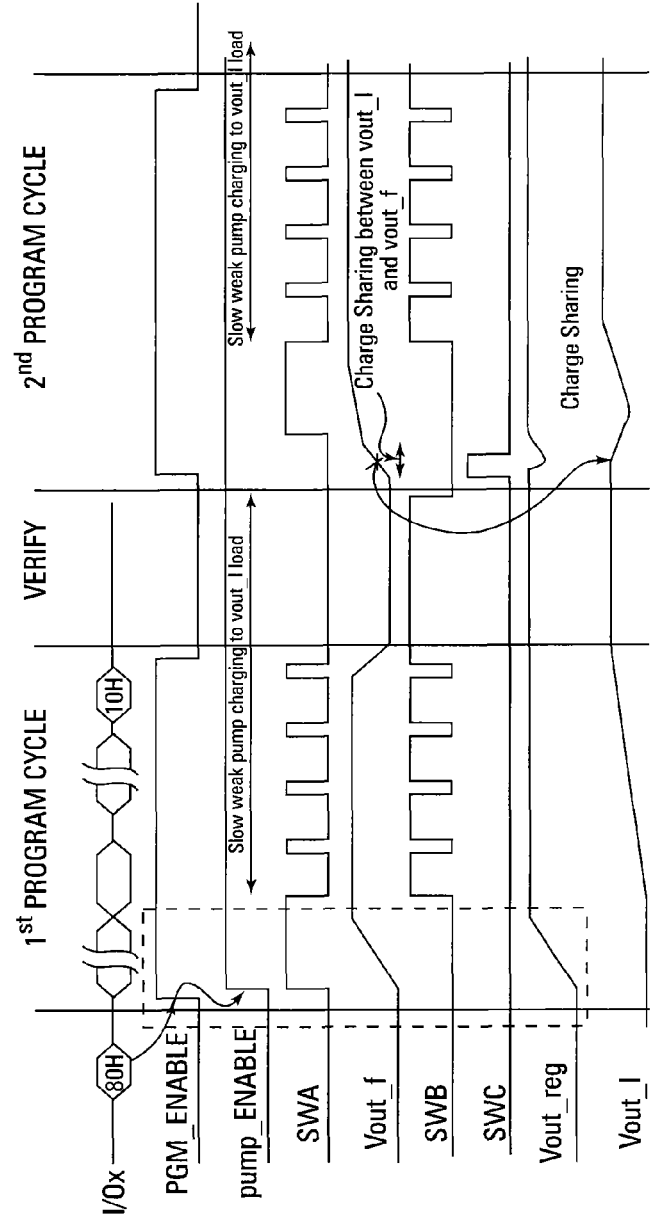
FIG. 5 shows a timing diagram of one embodiment of the operation of the charge pump circuit of FIG. 5.

FIG. 5 illustrates a timing diagram of one embodiment of the circuit of FIG. 4. This diagram illustrates the I/Ox line that carries the desired operation commands (i.e., read, write, erase), the data to be programmed/read, and the address to which the data is to be written/read.

The PGM_ENABLE line illustrates the state of the program enable signal to memory controller circuit to initiate the program operation. This signal also causes the memory controller to generate the PUMP_ENABLE signal. This signal is responsible for enabling the charge pump device 400 of FIG. 4 to begin the programming operation.

The $V_{out\_f}$ signal represents the voltage on the target load as a result of the closing of SWC 415. $V_{out\_reg}$ signal is the voltage that is output from the pump 400. $V_{out\_I}$ is the voltage at the intentional load 405. The SWA, SWB, and SWC lines represent the opening and closing of the switches 411, 413, 415 of FIG. 4.

In operation, the first program cycle is initiated by a program command or address load command on the I/Ox line. The illustrated command is 80 H but this is for purposes of illustration only as the present invention is not limited to any one received command value or received command that is responsible for initiating the PGM_ENABLE. The received command causes the PGM_ENABLE line to go high to initiate the program operation. The PGM_ENABLE signal causes the PUMP ENABLE signal to go high and turn on the charge pump 400. The charge pump remains on during the data loading operation.

$V_{out\_reg}$ starts from 0V and rises to a target voltage with SWA closed. The target voltage is dependent on the embodiment and can be any voltage required for programming the memory cell (e.g. 20V). Since $V_{out\_reg}$ sees the fixed loading capacitance of the target load 403+parasitic load 401, $V_{out\_reg}$ rises with an RC time constant. Since SWA is closed, $V_{out\_f}$ also tracks $V_{out\_reg}$. $V_{out\_I}$ starts from 0V and rises to the target voltage with the closing of SWB 413.

Once $V_{out\_reg}$ reaches the target voltage, the pump 400 is idling (i.e., turned off or slowed down) with just enough output to maintain the $V_{out\_reg}$ node at the target voltage. This compensates for junction leakage at the $V_{out\_reg}$ node connections.

SWB 413 begins to open and close as shown in FIG. 5. This charges the intentional load 405. As can be seen in the timing diagram, SWA 411 and SWB 413 are clocking in an inverse pattern during the remainder of the first program cycle. SWA 411 is closing to compensate for leakage current by the target load 403. SWB 413 is closing to charge the intentional node and to compensate for leakage current by the intentional load 405.

During the verify cycle, the PUMP_ENABLE signal remains high, SWA 411 is open, and SWB 413 remains closed. This provides a slow, weak charging to $V_{out\_I}$ at the intentional load 405.

During the second program cycle, PUMP_ENABLE remains high. The stored charge in the intentional load 405 is then used to charge up the target load 403 by charge sharing. This is accomplished by closing SWC 415 as shown in FIG. 5. Both SWA 411 and SWB 413 are open when SWC 415 momentarily closes. The charge sharing between $V_{out\_I}$ and $V_{out\_f}$ causes only a minor downward spike in the $V_{out\_reg}$ signal that is substantially reduced from the prior art. The peak reduction results in substantially more stable memory device operation.

The $V_{out\_f}$ signal begins to rise with the charge sharing initiated by closing SWC 415. The initial slope of $V_{out\_f}$ in the timing diagram of FIG. 5 is the result of the charge sharing. SWC 415 then opens and SWA 411 closes to couple the target load 403 to $V_{out\_reg}$ to continue charging up $V_{out\_f}$. For the remainder of the second program cycle, SWA 411 and SWB 413 again clock on and off in an inverse fashion, as shown in the timing diagram, in order to compensate for the leakage current occurring in their respective loads 403, 405.

Figure 6:
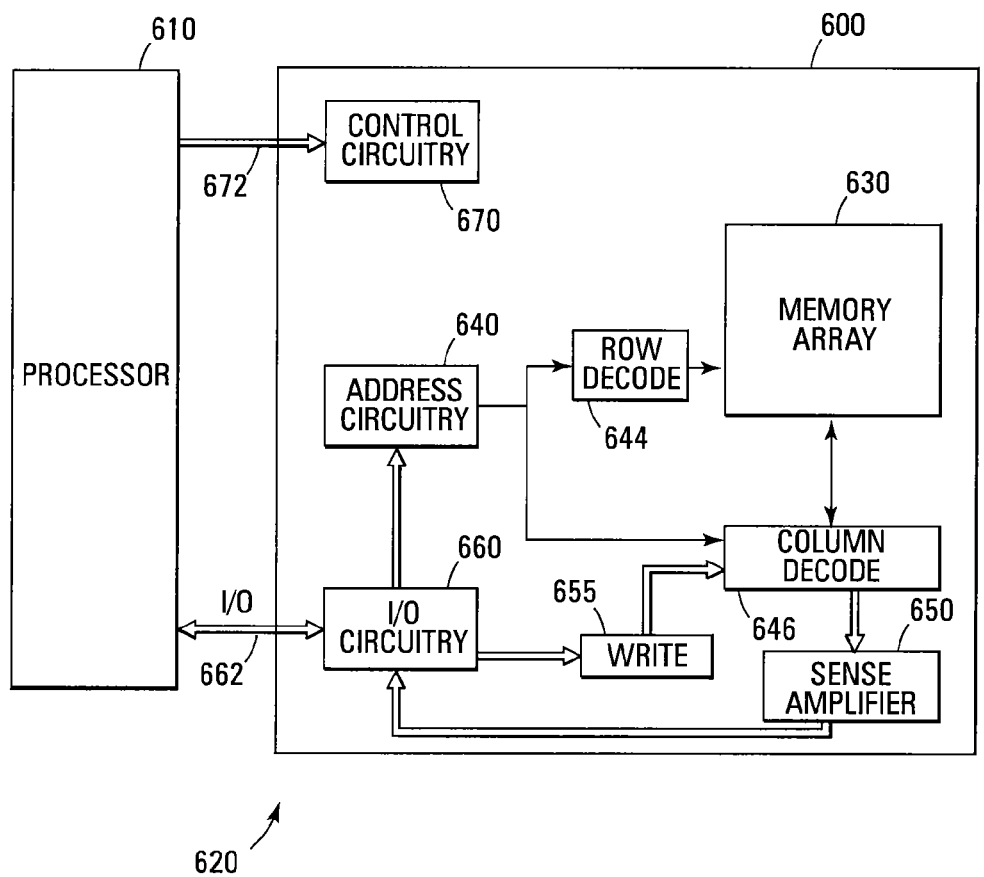
FIG. 6 shows a block diagram for one embodiment of a memory system of the present invention.

FIG. 6 illustrates a functional block diagram of a memory device 600 that can incorporate the embodiments for programming the non-volatile memory cells of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of flash memory cells 630 or some other type of non-volatile memory cells. The memory array 630 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 640 is provided to latch address signals provided over I/O connections 662 through the I/O circuitry 660. Address signals are received and decoded by row decoders 644 and column decoders 646 to access the memory array 630. It will be appreciated by those skilled in the art that, with the benefit of the present description, the number of address input connections and row/column decoders depends on the density and architecture of the memory array 630. That is, the number of addresses increases with both increased memory cell counts and increased bank and block counts.

The memory integrated circuit 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over the I/O connections 662 with the processor 610. Write circuitry 655 is provided to write data to the memory array.

Control circuitry 670 decodes signals provided on control connections 672 from the processor 610. These signals are used to control the operations on the memory array 630, including data read, data write, and erase operations. The control circuitry 670 may be a state machine, a sequencer, or some other type of controller. The control circuitry 670 of the present invention, in one embodiment, is responsible for executing the embodiments of the programming method and charge pump control of the present invention.

The flash memory device illustrated in FIG. 6 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 7:
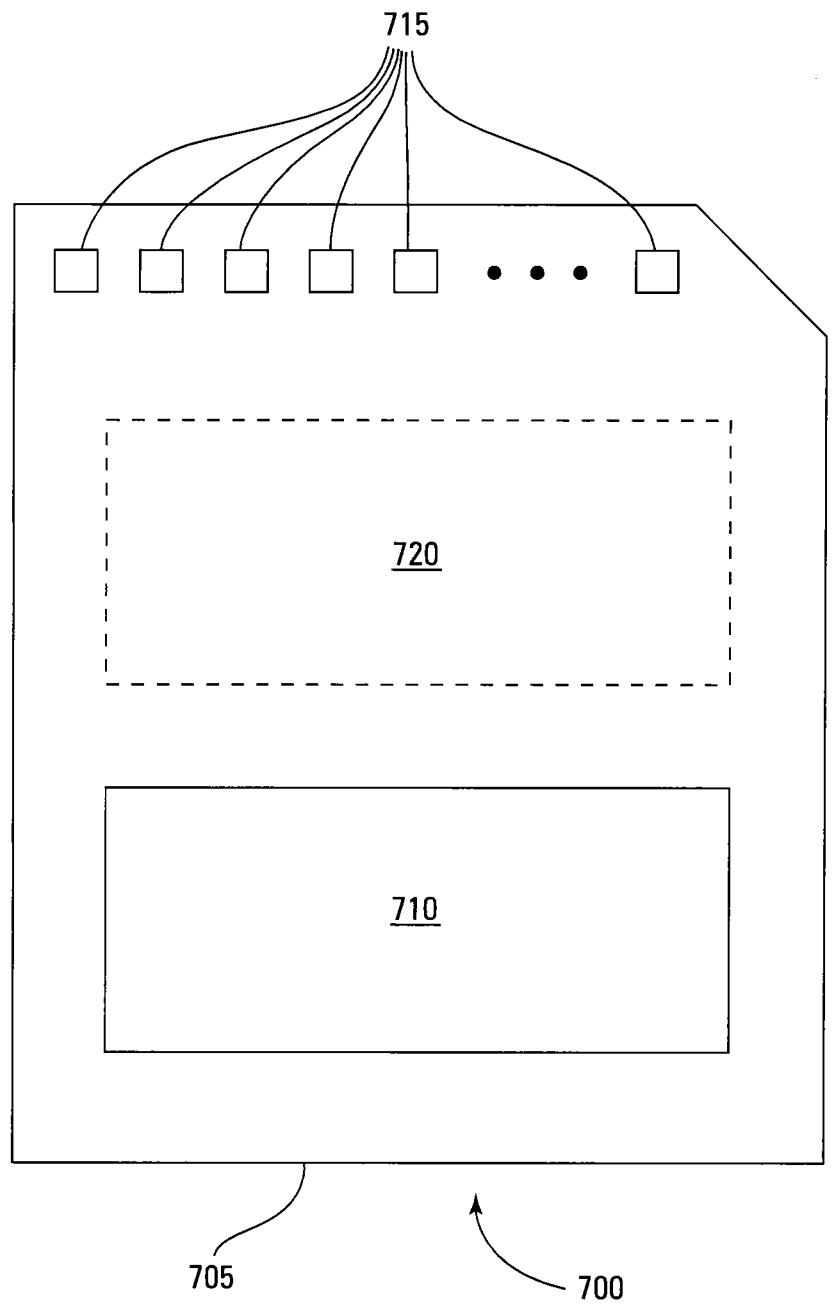
FIG. 7 shows a block diagram for one embodiment of a memory module of the present invention.

FIG. 7 is an illustration of a memory module 700 that incorporates the memory cell embodiments as discussed previously. Although the memory module 700 is illustrated as a memory card, the concepts discussed with reference to the memory module 700 are applicable to other types of removable or portable memory, e.g., USB flash drives. In addition, although one example form factor is depicted in FIG. 7, these concepts are applicable to other form factors as well.

The memory module 700 includes a housing 705 to enclose one or more memory devices 710 of the present invention. The housing 705 includes one or more contacts 715 for communication with a host device. Examples of host devices include digital cameras, digital recording and playback devices, PDAs, personal computers, memory card readers, interface hubs and the like. For some embodiment, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on COMPACTFLASH memory cards licensed by SANDISK Corporation, MEMORY STICK memory cards licensed by SONY Corporation, SD SECURE DIGITAL memory cards licensed by TOSHIBA Corporation and the like. In general, however, contacts 715 provide an interface for passing control, address and/or data signals between the memory module 700 and a host having compatible receptors for the contacts 715.

The memory module 700 may optionally include additional circuitry 720. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710. The additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

In summary, the embodiments of the present invention provide stable memory device operation and reduced program time by enabling the charge pump at some point prior to the data load instead of after the data load, as in the prior art. This minimizes the pump driving current during the program cycle start in order to reduce the supply peak current, thus providing stable device operation. Additionally, an intentional load provides charge sharing to reduce the load on the regulated voltage output from the pump during program cycle start.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for operating a charge pump in a charge pump circuit of a memory device, the charge pump circuit comprising a first load coupled to the charge pump through a first switch, a second load coupled to the charge pump through a second switch and a third switch coupling the first load to the second load, the method comprising:

activating the charge pump prior to a data loading operation during programming of the memory device;

during a first programming cycle, charging a first load voltage on the first load from the charge pump;

during the first programming cycle, charging a second load voltage on the second load from the charge pump; and during a second programming cycle, recharging the first load voltage from the second load voltage.

2. The method of claim 1 wherein recharging comprises activating the third switch to couple the first load to the second load.

3. The method of claim 1 wherein the first and second load voltages are charged to a target voltage.

4. The method of claim 3 wherein during a verify operation between the first and second programming cycles, the first load voltage is less than the target voltage.

5. The method of claim 4 wherein during the verify operation the first load voltage is 0V.

6. The method of claim 3 wherein recharging comprises:
increasing the first load voltage to a first voltage level that is less than the target voltage; and
increasing the first load voltage from the first voltage level to the target voltage in response to activation of the first switch.

7. The method of claim 1 and further including deactivating the first switch during a verify operation such that the first load voltage goes to 0V.

8. The method of claim 3 and further including:
deactivating the first switch during a verify operation between the first and second programming cycles such that the first load voltage returns to 0V;
activating the second switch during the verify operation such that the second load voltage remains substantially at the target voltage;
activating the third switch during the second programming cycle for a predetermined time such that the first load voltage charges from 0V to a first predetermined voltage level; and
activating the first switch to increase the first load voltage from the first predetermined voltage level to substantially the target level.

9. A method for operating a charge pump in a charge pump circuit of a memory device, the charge pump circuit comprising a first load coupled to the charge pump through a first switch, a second load coupled to the charge pump through a second switch and a third switch coupling the first load to the second load, the method comprising:

activating the charge pump, in response to a received command, prior to a data loading operation during programming of the memory device;

charging, in response to a first programming cycle, a first voltage on the first load from the charge pump;

charging, in response to the first programming cycle, a second voltage on the second load from the charge pump; and recharging, in response to a second programming cycle subsequent to the first programming cycle, the first voltage from the second voltage.

10. The method of claim 9 wherein recharging comprises:
coupling the first load to the second load to recharge the first voltage from a first voltage level to a second voltage level that is less than a target voltage that is determined by the charge pump; and
subsequently coupling the first load to the charge pump to recharge the first load voltage from the second voltage level to the target voltage.

11. The method of claim 9 wherein the received command is a programming command.

12. The method of claim 11 and further including:
decoupling the first load from the charge pump during a verify cycle; and
coupling, during the verify cycle, the second load to the charge pump such that the second voltage remains substantially at a target voltage.

13. The method of claim 9 wherein the memory device is a non-volatile memory device having one of a NAND architecture, a NOR architecture, or an AND architecture.

14. The method of claim 9 wherein the received command is an address load command to initiate the programming.

15. The method of claim 9 and further comprising maintaining the charge pump in an enabled state during the data loading operation.

16. A method for operating a charge pump circuit, the charge pump circuit comprising a charge pump, a first load coupled to the charge pump through a first switch, a second load coupled to the charge pump through a second switch and a third switch coupling the first load to the second load, the method comprising:

activating the charge pump in response to a command;

charging, in response to a first programming cycle, a first voltage on the first load from the charge pump;

charging, in response to the first programming cycle, a second voltage on the second load from the charge pump; and recharging, in response to a second programming cycle subsequent to the first programming cycle, the first voltage from the second voltage.

17. The method of claim 16 wherein the first voltage is a programming voltage to program a selected memory cell.

18. The method of claim 16 wherein activating comprises generating an enable signal coupled to the charge pump.

19. The method of claim 18 wherein a memory controller circuit generates the enable signal responsive to a program enable signal.

20. The method of claim 16 and further comprising idling the charge pump when a regulated output voltage from the charge pump circuit reaches the first voltage.

* * * * *